(12) United States Patent
Sekikawa et al.

(10) Patent No.: US 6,307,251 B1
(45) Date of Patent: Oct. 23, 2001

(54) SEMICONDUCTOR DEVICE HAVING CAPACITANCE ELEMENT AND METHOD OF PRODUCING THE SAME

(75) Inventors: Nobuyuki Sekikawa; Koichi Hirata; Wataru Andoh; Noriyasu Katagiri, all of Niigata (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/444,820

(22) Filed: Nov. 22, 1999

(30) Foreign Application Priority Data

Nov. 27, 1998 (JP) ................................. 10-337848
Dec. 21, 1998 (JP) ................................. 10-362509
Nov. 10, 1999 (JP) ................................. 11-319052

(51) Int. Cl.[7] ................................................. H01L 29/00
(52) U.S. Cl. ........................... 257/532; 257/295; 257/306
(58) Field of Search ................................. 257/532, 295, 257/300, 306, 308, 379, 71, 550, 903, 904

(56) References Cited

U.S. PATENT DOCUMENTS 5,396,456 * 3/1995 Liu et al. ............................... 365/174
5,414,291 * 5/1995 Miwa et al. ........................... 257/370
5,483,082 * 1/1996 Takizawa et al. ...................... 257/59
5,773,860 * 6/1998 Kijima et al. ......................... 257/306
6,160,282 * 12/2000 Merrill ................................. 257/292

* cited by examiner

Primary Examiner—Nathan Flynn
Assistant Examiner—Remmon R. Fordé
(74) Attorney, Agent, or Firm—Fish & Richardson P.C.

(57) ABSTRACT

To shorten the production process of the semiconductor device having the capacitance element. The pad oxide film (2) and the first polycrystalline silicon layer (3) are used as a stress buffering material at the time of formation of the element separation oxide film. These are not removed and used as the capacitance insulation film and a portion of the upper electrode of the capacitance element. Thereby, the removing process of the pad.polycrystalline silicon layer, and the dummy oxidation and its removing process in the conventional example, can be omitted and the process can be shortened. Further, a problem of the impurity enhanced oxidation at the time of formation of the capacitance insulation film can be solved.

5 Claims, 6 Drawing Sheets

SEMICONDUCTOR DEVICE HAVING CAPACITANCE ELEMENT AND METHOD OF PRODUCING THE SAME

BACKGROUND OF THE INVENTION

1. Field of the Invention

The present invention relates to a semiconductor device having a capacitance element and method of producing the same, and particularly to a technology to shorten a production process of the semiconductor device.

2. Description of the Related Art

A capacitance element is used for a capacitor of a delay circuit and an integration circuit of an LSI, and a DRAM cell. Conventionally, a method to make the capacitance element in the semiconductor device is, for example, as follows.

Initially, a selective oxidation process using a LOCOS method is performed. As a method used when a selective oxide film is formed by the LOCOS method, so called a PBL method (Poly-Buffered LOCOS method) is well known. The PBL method is a method in which, in order to reduce a bird's beak, previously an insulation film (hereinafter, called pad oxide film) and polycrystalline silicon layer (hereinafter, called pad.polycrystalline silicon layer) are formed between an oxidation resisting film and a semiconductor substrate as a buffer layer. Then, the oxidation resisting film such as silicon nitride film ($Si_3N_4$ film) is formed on this upper layer, and by conducting thermal oxidation, an element separation film is formed. After that, the pad polycrystalline silicon layer, the silicon nitride film, or the like, are removed, and after that, a dummy oxide film is formed by thermal oxidation.

Then, through the dummy oxide film, impurities such as phosphorous or the like, are ion-implanted into the silicon substrate, and an impurity layer is formed. The dummy oxide film is the buffer film for the ion implantation.

Then, the dummy oxide film is removed, and thermal oxidation is performed again, and a gate oxide film is formed on the impurity layer. This is a capacitance oxide film, and at the same time, a gate oxide film of a MOSFET.

Further, the polycrystalline silicon layer is formed on the gate oxide film. In this manner, the capacitance element formed of the gate oxide film and the polycrystalline silicon layer is formed.

SUMMARY OF THE INVENTION

However, after the element separation film is formed by the PBL method, there is a removing process of the pad polycrystalline silicon layer, and further, the formation and removing process of the dummy oxide film, and therefore, there are many manufacturing processes.

Further, when the capacitance oxide film is formed on the impurity layer, there is a problem that the film thickness is increased by the impurity enhanced oxidation, and the capacitance value per unit area is decreased. For example, when phosphorous is implanted by a dose amount of $1 \times 1015/cm^2$, in the case where the oxide film thickness is 100 Å on the silicon substrate having no impurity layer, the film thickness becomes 400 Å on the impurity layer. This is disadvantageous in that, when such the capacitance element is used, for example, for the capacitor of a DRAM, its occupancy area on a chip is increased.

Accordingly, an object of the present invention is to provide the structure of the semiconductor device by which the production processes can be reduced in the semiconductor device having the capacitance element, and its production method.

Further object of the present invention is to solve a problem of the impurity enhanced oxidation accompanied by the formation of the capacitance oxide film, and to reduce the occupancy area of the capacitance element.

The above described and the other objects and new characteristics of the present invention will be cleared from the description of the present specification and accompanied drawings.

Outlines of the representative embodiments in the present invention will be explained as follows.

A semiconductor device having a capacitance element of the first aspect comprises: an element separation film formed so as to surround an element formation area on the first conductive-type semiconductor substrate; the second conductive-type impurity layer formed on the surface of the element formation area; a capacitance insulation film formed of a pad oxide film formed on the impurity layer; the first silicon layer formed of a pad silicon layer formed on the capacitance insulation film; and the second silicon layer which is formed on the first silicon layer and extends on the element separation film, and the first and the second silicon layers are made an upper electrode of the capacitance element, and the impurity layer is made a lower electrode of the capacitance element.

According to such an aspect, the pad oxide film and the pad silicon layer used at the time of the element separation film formation are not removed, and are respectively used as the capacitance insulation film and the first silicon layer, therefore, by omitting removing process of these film and layer, the production process of the semiconductor device having the capacitance element can be reduced. Further, in the element formation area, the first and the second silicon layers are stacked, and further, the second silicon layer extends for wiring on the element separation film, therefore, the difference in level between the upper electrode and the wiring on the element separation film can be reduced.

The semiconductor device having the capacitance element of the second aspect is that, in the first aspect, the first and the second silicon layers are a polycrystalline silicon layer or an amorphous silicon layer.

The semiconductor device having the capacitance element of the third aspect is that, in the second aspect, the first silicon layer is the polycrystalline silicon layer or the amorphous silicon layer in which the impurities are doped in higher density than that of the second silicon layer.

When the second silicon layer is made to the silicide, it is not necessary to be doped in high density, and because the second silicon layer positioned on the element separation film is not doped in high density, it is prevented that the impurities reach the surface of the element separation film and thereby, deterioration of dielectric strength and moisture resistance occurs.

The semiconductor device having the capacitance element of the fourth aspect is that the second silicon layer is covered by the metallic silicide film in the first or the second aspect.

According to such the means, the resistance of the silicon layer can be reduced.

The semiconductor device having the capacitance element of the fifth aspect is as follows: it has: the capacitance element comprising the element separation film formed so as to surround the element formation area on the first conductive-type semiconductor substrate, the second conductive-type impurity layer formed on the surface of the element formation area; the insulation film formed of the pad oxide film formed in the element formation area, and a cell plate electrode formed on the insulation film; and the MOSFET composed of a source layer which is formed in the situation that it adjoins the capacitance element and is superimposed on the impurity layer, a drain layer constituting a bit line, the insulation film constituting a gate insulation film, and a gate electrode constituting a word line, in which the cell plate electrode and the gate electrode are structured such that the first silicon layer and the second silicon layer which are formed of the pad silicon layers, are stacked on the element formation area, and the second silicon layer constituting the cell plate electrode extends on the element separation film.

According to such the means, the production process of a memory cell of the DRAM having the capacitance element can be shortened.

A method of producing a semiconductor device having the capacitance element of the sixth aspect has: a process forming the pad oxide film, the first silicon layer and the oxidation resisting film on the element formation area of the semiconductor substrate; a process forming the element separation film by the thermal oxidation; a process in which only the oxidation resiting film is removed, and the pad oxide film and the first silicon layer are left in the element formation area; a process by which ion implantation is performed passing through the pad oxide film and the first polycrystalline silicon layer, and the second conductive-type impurity layer is formed on the surface of the semiconductor substrate; and a process by which the second silicon layer is formed on the first polycrystalline silicon, in which the first and the second silicon layers are the upper electrode of the capacitance element, the pad oxide film is the capacitance insulation film, and the second conductive-type impurity layer is the lower electrode of the capacitance element.

According to the above described means, when the element separation oxide film is formed, the pad oxide film and the first silicon layer are used as a stress buffering member, and these are not removed, and when the impurity layer which is the lower electrode of the capacitance element, is formed by the ion implantation, these are used as buffer films for the ion implantation. When the first silicon layer is thinly formed, the acceleration energy of the ion implantation may be small.

According to this, the removing process of the pad oxide film and the pad polycrystalline silicon layer in the conventional example, and the dummy oxidation and its removing process can be omitted, thereby, the processes can be shortened.

Further, the pad oxide film is used as the capacitance insulation film, and after formation of the pad oxide film, the impurity layer is formed. Accordingly, the impurity enhanced oxidation at the formation of the capacitance insulation film can be suppressed.

A method of producing a semiconductor device having the capacitance element of the seventh aspect has: a process to form the pad oxide film, the first silicon layer, and the silicon nitride film on the element formation area on the semiconductor substrate; a process to form the element separation oxide film by the thermal oxidation; a process by which only nitride film is removed, and the pad oxide film and the first silicon layer are left in the element formation area; a process in which the ion implantation is performed passing through the pad oxide film and the first silicon layer, and the second conductive-type impurity layer is formed on the surface of the semiconductor substrate; a process to form the second silicon layer on the first silicon; a process to remove the first and the second silicon layers and the pad oxide film on a contact formation area defined on the element formation area; and a process to form a metallic electrode to contact to the second conductive-type impurity layer exposed on the contact formation area, in which the first and the second silicon layers are the upper electrode of the capacitance element, the pad oxide film is the capacitance insulation film, and the second conductive-type impurity layer is the lower electrode of the capacitance element.

According to such the means, the same effects as in the sixth aspect can be obtained.

A method of producing a semiconductor device having the capacitance element off the eighth aspect is that, in the sixth and the seventh aspects, the first and the second silicon layers are the polycrystalline silicon layer or amorphous silicon layer.

A method of producing a semiconductor device having the capacitance element of the ninth aspect is that the first silicon layer is the polycrystalline silicon layer or amorphous silicon layer in which the impurities in the first silicon layer are doped in higher density than that in the second silicon layer.

A method of producing a semiconductor device having the capacitance element of the tenth aspect is that, in the sixth or the seventh aspect, the second silicon layer is covered with the metallic silicide film.

DETAILED DESCRIPTION OF THE INVENTION

Hereinafter, referring to FIG. 1 through FIG. 10, embodiments of the present invention will be described.

Initially, referring to FIG. 1 through FIG. 4, the first embodiment of the present invention will be described.

Figure 1A:
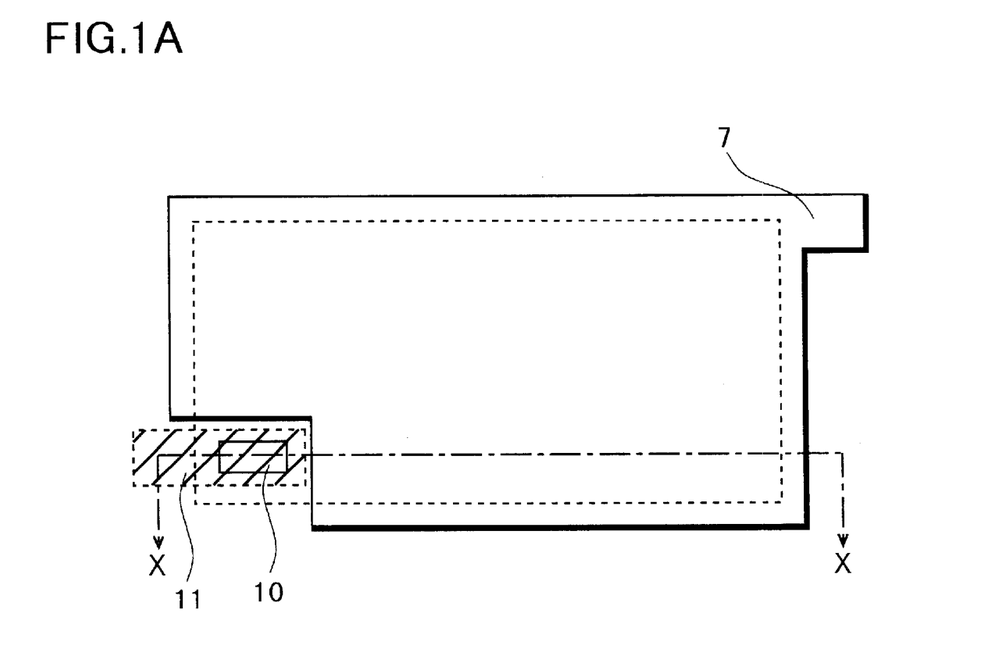
FIG. 1 is a view showing a semiconductor device and its production method according to the first embodiment of the present invention.
Figure 1B:
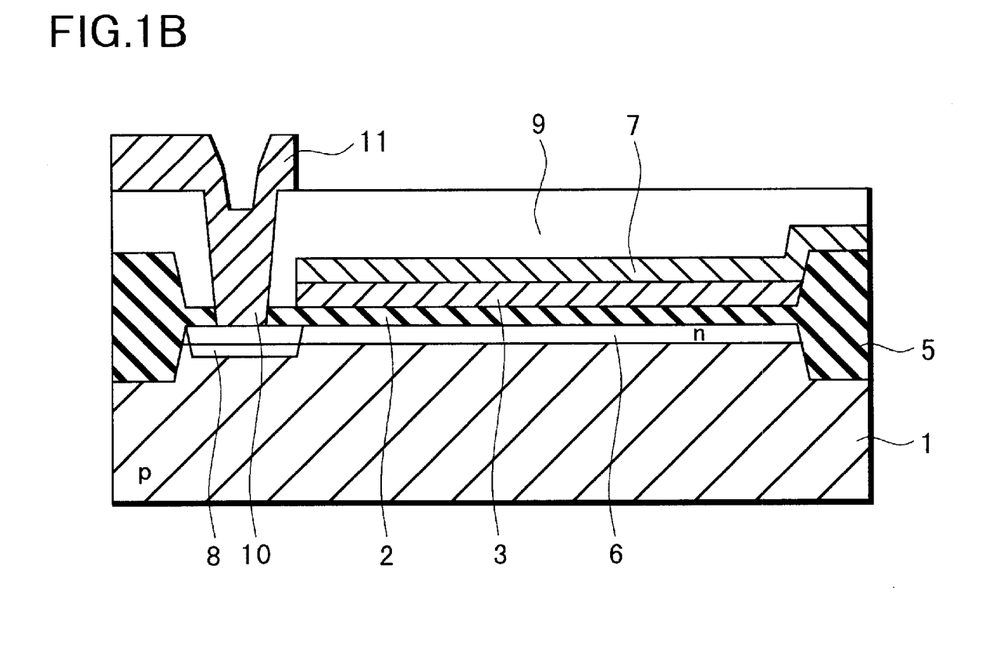

FIG. 1 is a view showing a capacitance element formed on a semiconductor substrate. FIG. 1(a) is a plan view and FIG. 1(b) is a sectional view taken on line X—X in FIG. 1(a).

An area surrounded by a broken line is an element formation area, and in this area, the capacitance element and a MOSFET (not shown) are formed. The element formation area is surrounded by an element separation oxide film (5). The element separation oxide film (5) is formed by, for example, a PBL method.

In the capacitance element, an n-type impurity layer (6) on the surface of a p-type silicon substrate (1) is a lower electrode. A pad oxide film (2) is a capacitance insulation film. Further, the first polycrystalline silicon layer (3) and the second polycrystalline silicon layer (7) stacked thereon are an upper electrode. Instead of the polycrystalline silicon layers, an amorphous silicon layer may be formed.

Herein, the pad oxide film (2) and the first polycrystalline silicon layer (7) ae not removed, and respectively used as a capacitance insulation film and a portion of the upper electrode.

The second polycrystalline silicon layer (7) extends on the element separation oxide film (5) for wiring. Herein, in the element separation oxide film (5), only the second polycrystalline silicon layer (7) exists, and on the capacitance insulation film (2), the first and the second polycrystalline silicon layers (3) and (7) are stacked.

Thereby, the difference in level between the upper electrode by the element separation oxide film and the wiring on the element separation oxide film (5) is reduced. That is, the difference in level between the upper surface of the upper electrode of the element formation area and the upper surface of the second polycrystalline silicon layers (7) on the element separation oxide film (5), is reduced by the thickness of the first polycrystalline silicon layer (3).

Accordingly, when a layer insulation film such as a BPSG film is formed on the second polycrystalline silicon layer (7), the layer insulation film is made flat. Therefore, when the wiring is formed on this layer insulation film, a lithography process can be easily carried out.

Further, a contact formation area is defined in the element formation area. The first and the second polycrystalline silicon layers (3, 7) and the pad oxide film (2) on the contact formation area are removed. An n+diffused layer (8) which is superimposed on the n-type impurity layer (6), is formed on the silicon substrate (1) in this area, and is in contact with an Al electrode (11).

Hereinafter, referring to FIG. 1 through FIG. 4, the method of producing a semiconductor device having the capacitance element will be described. Incidentally, FIG. 1 through FIG. 4 show sectional views taken on line X—X in FIG. 1(a), in each process.

Figure 2:
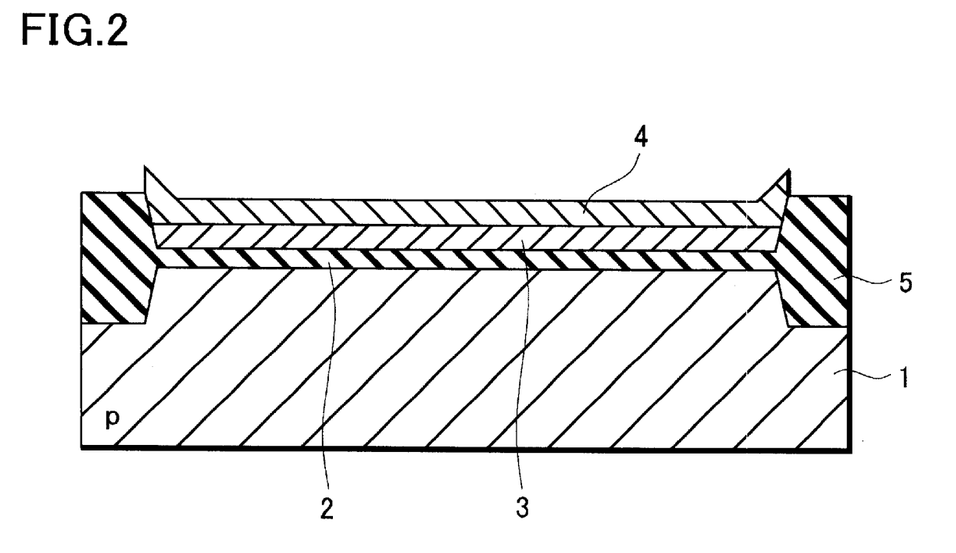
FIG. 2 is a sectional view showing a method of producing a semiconductor device according to the first embodiment of the present invention.

As shown in FIG. 2, the pad oxide film (2), the first polycrystalline silicon layer (3) and the silicon nitride film ($Si_3N_4$ film) (4) are formed on a P-type silicon substrate (1), and these are selectively etched and left on the element formation area.

Then, by the field oxidation, the element separation oxide film (so-called Locos) (5) is formed. Its film thickness is about 3500 Å–4500 Å.

Herein, the pad oxide film (2) is formed into a predetermined film thickness, for example, about 50 Å–100 Å by the thermal oxidation method. This pad oxide film (2) has also an role as a buffer material at the time of the field oxidation. The first polycrystalline silicon layer (3) is a film to reinforce the buffer role of the pad oxide film, and is formed into the film thickness of about 500 Å–1000 Å by an LPCVD method. The silicon nitride film (4) is an oxidation-resisting film for the field oxidation, and is formed into the film thickness of about 700 Å by the LPCVD method.

Then, the silicon nitride film (4) is removed by thermal phosphoric acid processing. The pad oxide film (2) and the first polycrystalline silicon layer (3) of the lower layer are left as they are. That is, the removing process of the pad oxide film (2) and the first polycrystalline silicon layer (3) is omitted.

Figure 3:
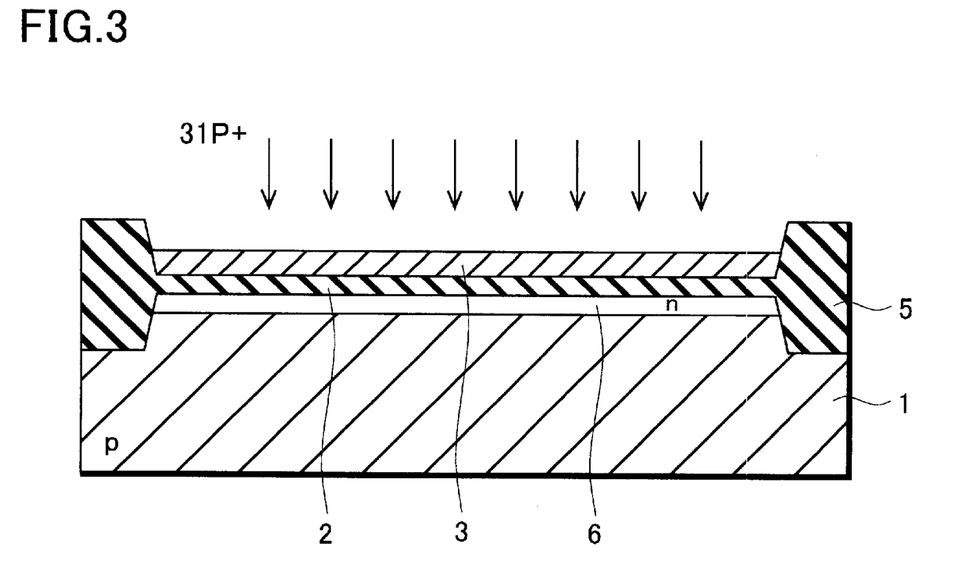
FIG. 3 is a sectional view showing a method of producing a semiconductor device according to the first embodiment of the present invention.

Next, as shown in FIG. 3, ion implantation is performed by penetration the pad oxide film (2) and the first polycrystalline silicon layer (3)performed, and n-type impurity layer (6) is formed on the surface of the silicon substrate (1). This ion implantation is performed under the condition that phosphorus (31P+) is implanted, for example, in a dose amount of $1\times1014/cm^2$, by acceleration energy of 80 KeV. Herein, the pad oxide film (2) and the first polycrystalline silicon layer (3) act as the buffer film for the ion implantation.

As described above, ion implantation is performed by Penetrationg the pad oxide film (2) and the first polycrystalline silicon layer (3) performed, and these films are left as they are, therefore, a problem of an increase of the film thickness of the capacitance insulation film by the impurity enhanced oxidation can be solved. Further, when the first polycrystalline silicon layer (3) is fully thin, the acceleration energy of the ion implantation may be low, therefore, there is no problem in the production. Incidentally, an area into which the ion implantation is carried out, can be defined by using the photoresist (not shown).

Figure 4:
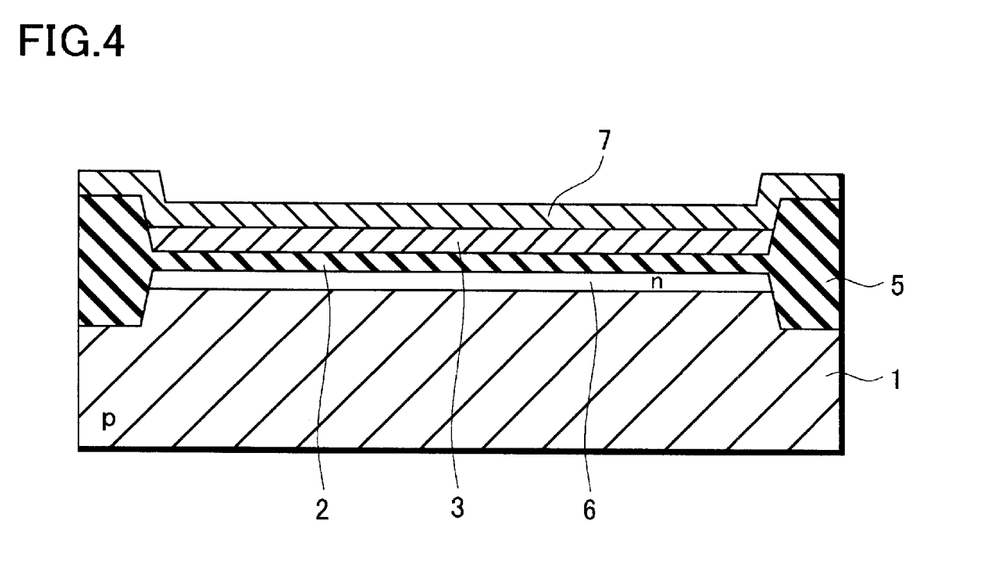
FIG. 4 is a sectional view showing a method of producing a semiconductor device according to the first embodiment of the present invention.

Next, as shown in FIG. 4, the second polycrystalline silicon layer (7) is accumulated on the entire surface by the LPCVD method. Its film thickness is about 500 Å–1000 Å. Then, phosphorus is doped in the second polycrystalline silicon layer (7) and the resistance is decreased. In this case, phosphorus is doped also in the first polycrystalline silicon layer (3). According to the above description, the basic structure of the capacitance element is formed.

Incidentally, in order to further decrease the resistance of the second polycrystalline silicon layer (7), it is good that a high melting point metallic silicide layer such as a tungsten silicide (WSix) is stacked thereon for formation.

Herein, because the second polycrystalline silicon layer (7) acts as an adherence layer of the element separation oxide film (5) and the metallic silicide layer, when the second polycrystalline silicon layer (7) is not formed, the tungsten silicide film can not be formed on the element separation film (5). Further, in order to make the polycrystalline silicon conductive, in the case where, for example, phosphorus is introduced in the polycrystalline silicon by using POC13, when there is not the second polycrystalline silicon layer (7), phosphorus is diffused also on the element separation oxide film (5). Therefore, the surface of the element separation oxide film (5) is made PSG (Phospho-Silicate-Glass). Accordingly, the disadvantages of deterioration of insulation dielectric strength and moisture proof occur.

Accordingly, when phosphorus is introduced in the situation that the second polycrystalline silicon layer (7) is formed, the formation of PSG on the surface of the element separation film (5) is prevented. On the one hand, phosphorus is introduced only in the first polycrystalline silicon layer (3), and phosphorus may be introduced from the first polycrystalline silicon layer (3) to the second polycrystalline silicon layer (7) by thermal diffusion. When the second polycrystalline silicon layer (7) is made to silicide, the resistance is fully decreased. Further, the impurity diffusion to the element separation oxide film (5) becomes small, thereby, the deterioration of insulation dielectric strength and moisture proof is prevented.

Next, a process until the structure of the capacitance element shown in FIG. 1(b) is completed, will be described. The second polycrystalline silicon layer (7) is selectively etched. Thereby, the second polycrystalline silicon layer (7) is extended on the element separation oxide film (5) for wiring, and the first and the second polycrystalline silicon layers (3) and (7) on the contact formation area defined in the element formation area and the pad oxide film (2) are removed.

Then, the n-type impurity such as arsenic is ion-implanted. Thereby, the n[+]diffused layer (8) which is superimposed on the n-type impurity layer (6) is formed on the silicon substrate (1) in an area adjoining the capacitance element.

Then, the layer insulation film (9) such as the BPSG film is accumulated on the entire surface by the LPCVD method, and a contact hole (10) is formed on the n[+]diffused layer (8). The Al electrode (11) which is in contact with the n[+]diffused layer (8), is formed.

In the manner described above, the capacitance element in which the second polycrystalline silicon layer (7) is the upper electrode of the capacitance element, the pad oxide film (2) is the capacitance insulation film, and the n-type impurity layer (6) is the lower electrode of the capacitance element, is formed. The lower electrode is taken out by the Al electrode (11).

Next, referring to FIG. 5 through FIG. 10, the second embodiment of the present invention will be described. This embodiment relates to a memory cell of a DRAM to which the capacitance element of the first embodiment is applied, and to its production method.

Figure 5:
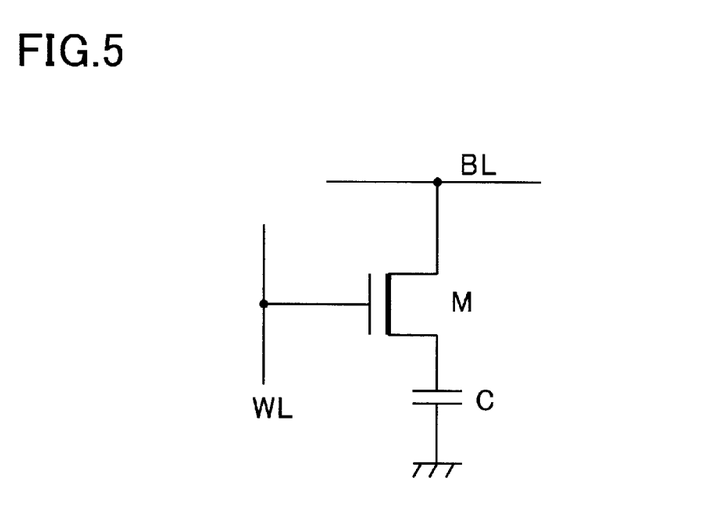
FIG. 5 is a view showing a DRAM memory cell.

The memory cell of the DRAM is composed of, for example, as shown in FIG. 5, one capacitance element (C) connected to the MOSFET (M). A gate of the MOSFET (M) is connected to a word line (WL), and a drain is connected to a bit line (BL). One end of the capacitance element (C) is connected to a source of the MOSFET (M), and the other end is connected to a cell plate electrode with the fixed potential.

Next, the production process of this DRAM memory cell will be described. The process to form the basic structure of the capacitance element is the same as that shown in FIG. 2 through FIG. 4, therefore, the explanation is omitted. However, as shown in FIG. 6, the ion implantation is performed so that the n-type impurity layer (6) is positioned only at the lower portion of the cell plate electrode (21) which is formed later, and the ion implantation is performed so as not to be implanted in the channel area of the adjoining MOSFET.

Figure 6:
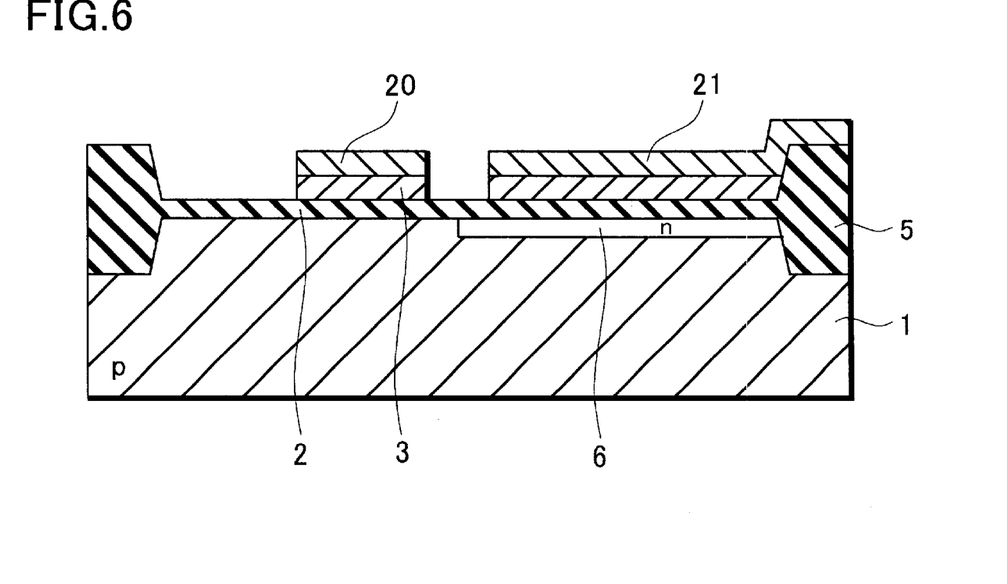
FIG. 6 is a sectional view showing a production method of a semiconductor device according to the second embodiment of the present invention.

As shown in FIG. 6, the first and the second polycrystalline silicon layers (3) and (7) are etched and stack-structured word line (20) and cell plate electrode (21) are formed. It goes without saying that instead of the first and the second polycrystalline silicon layers (3) and (7), the amorphous silicon layer may be used.

Figure 7:
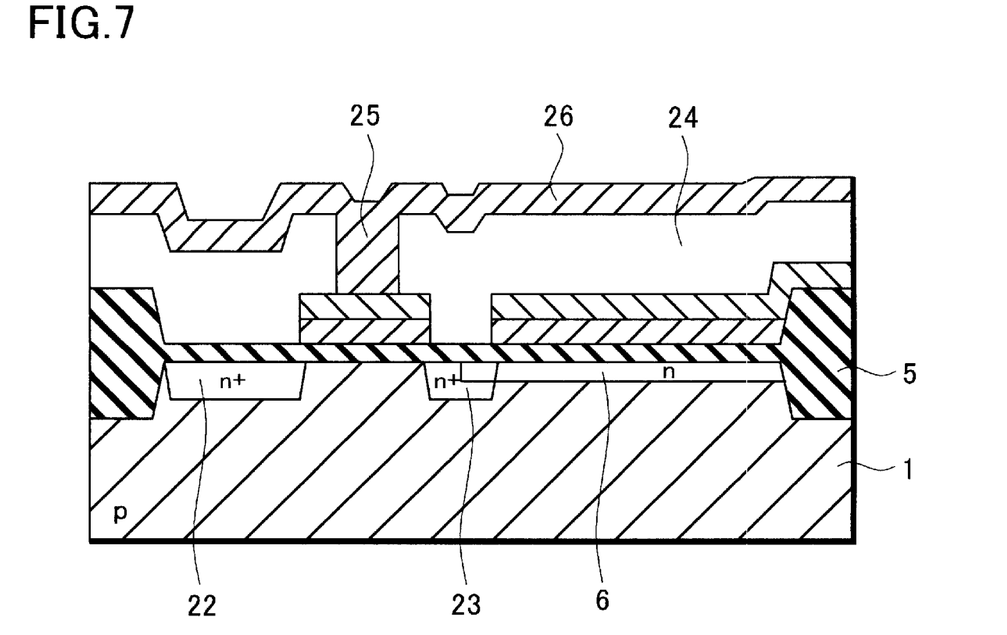
FIG. 7 is a sectional view showing a method of producing a semiconductor device according to the second embodiment of the present invention.

Next, as shown in FIG. 7, the n-type impurity such as arsenic is ion-implanted, and the bit line diffused layer (22) which is the drain of the MOSFET, and the source diffused layer (23) are formed. The source diffused layer (23) is superimposed on the n-type impurity layer (6). Then, the layer insulation film (24) is accumulated so that the film thickness is 6000 Å to 8000 Å, and a contact hole (25) is formed on the word line (20), and further, an Al word line (26) which is in contact with the word line (20), is formed.

As described above, because the pad oxide film (2) is used as it is, as the gate oxide film and the capacitance insulation film of the MOSFET, and further, the pad.polycrystalline silicon layer is used as a portion of the word line (20) and the cell plate electrode (21), the forming process of the DRAM memory cell can be shortened as a whole. Further, the cell plate electrode (21) is the stack structure composed of the first and the second silicon layers (3) and (7) on the capacitance insulation film, but on the element separation oxide film (5), it is the cell plate wiring of the single layer of the second silicon layer (7). Accordingly, in the same as in the first embodiment, the different in level between the word line (20) and the cell plate electrode (21) is decreased by the thickness of the first silicon layer (3). Accordingly, the layer insulation film (24) is made flat.

Incidentally, the memory cell forming process of the DRAM may also be performed as follows.

Figure 8:
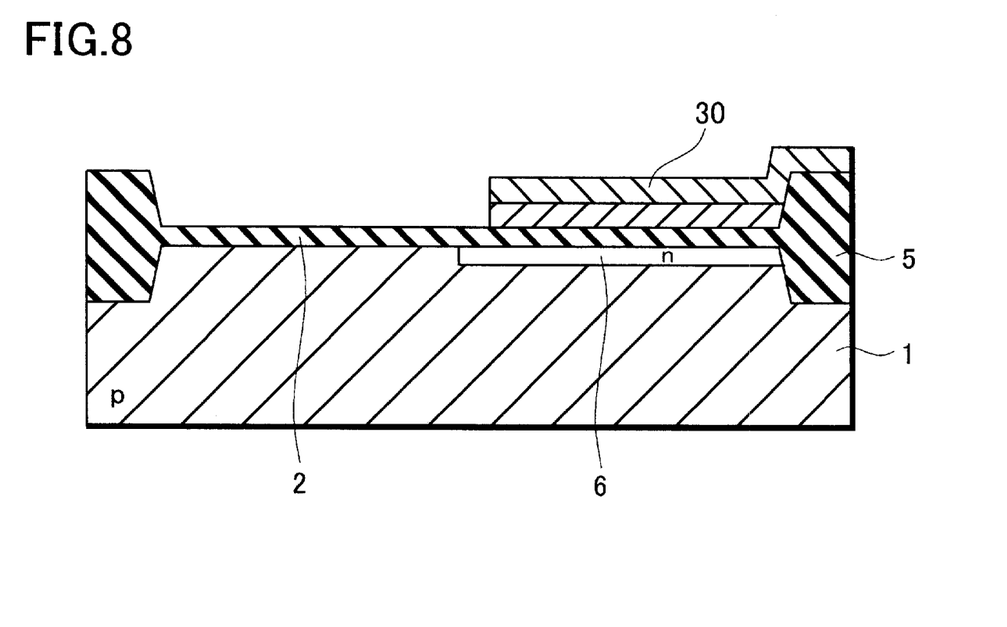
FIG. 8 is a sectional view showing a method of producing a semiconductor device according to the second embodiment of the present invention.

After the process shown in FIG. 2 through FIG. 4 is performed, as shown in FIG. 8, the first and the second polycrystalline silicon layers (3) and (7) are etched, and only cell plate electrode (30) is formed.

Figure 9:
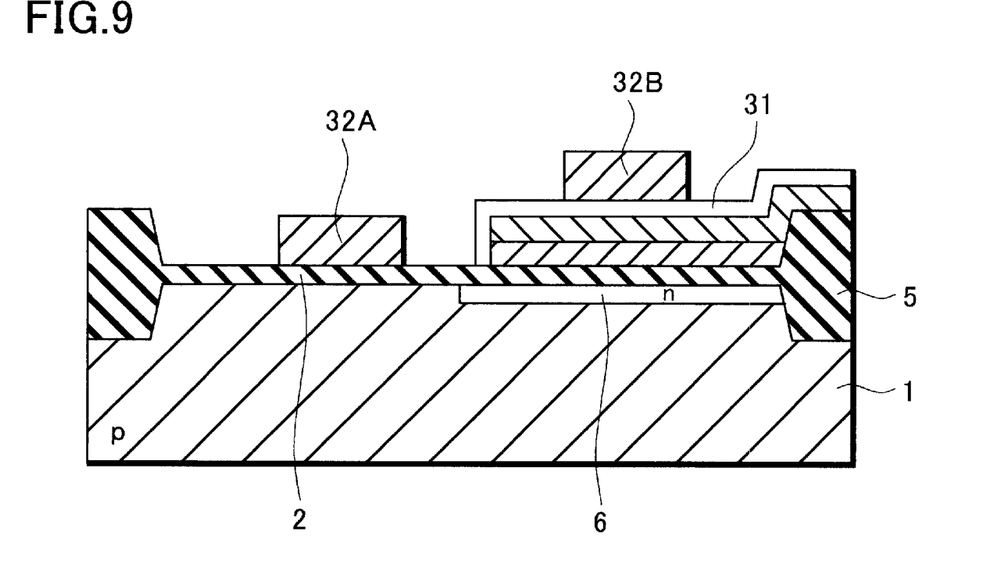
FIG. 9 is a sectional view showing a method of producing a semiconductor device according to the second embodiment of the present invention.

Next, as shown in FIG. 9, after a cell plate insulation film (31) which covers the cell plate electrode (30), is formed, the third polycrystalline silicon layer is accumulated so that the film thickness is about 1000 Å–2000 Å, and this is etched and the word lines (32A, 32B) are formed. The word line (32B) is that of the adjoining DRAM cell which is wired on the cell plate electrode (30) through the cell plate insulation film (31).

Figure 10:
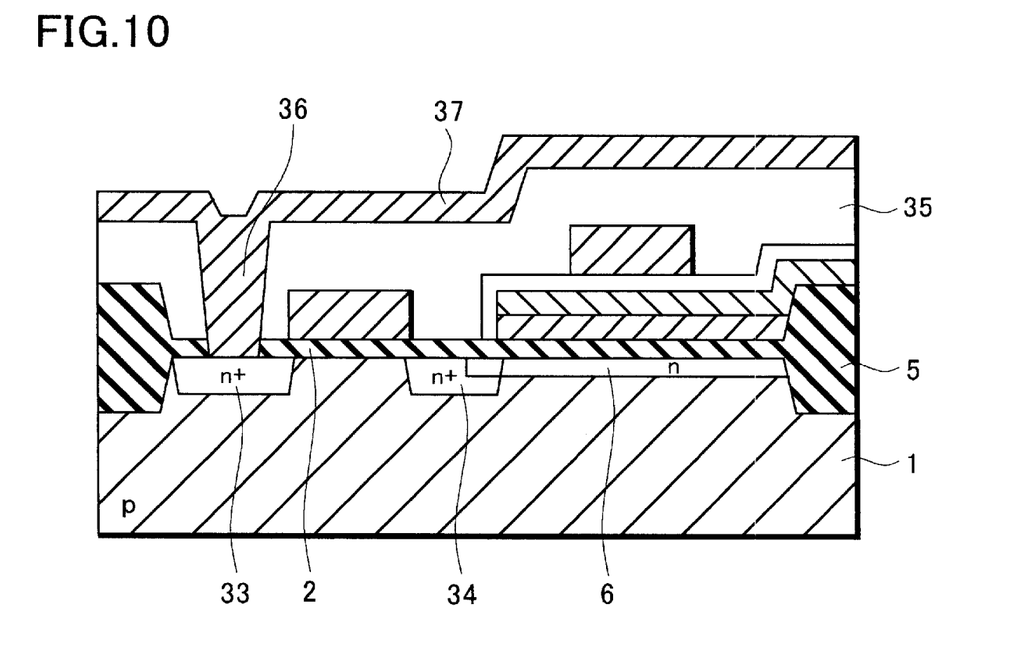
FIG. 10 is a sectional view showing a method of producing a semiconductor device according to the second embodiment of the present invention.

Next, as shown in FIG. 10, the n-type impurity such as arsenic is ion-implanted and the bit line diffused layer (33) which is the drain of the MOSFET, and the source diffused layer (34) are formed. The source diffused layer (34) is superimposed on the n-type impurity layer (6). Then, by the LPCVD method, the layer insulation film (35) such as a BPSG film is accumulated, and the contact hole (36) is formed on the bit line diffused layer (33), and the Al bit line (37) which is in contact with the bit line diffused layer (33), is formed.

Brief explanation of effects obtained by the representative ones of the inventions disclosed in the present invention is as follows. First, in the production process of the semiconductor device having the capacitance element, the removing process of the pad oxide film and pad silicon layer is omitted, and because these are reused as, for example, the capacitance insulation film and a portion of the upper electrode of the capacitance element, thereby, the process can be shortened.

Further, secondly, because the impurity layer of the lower electrode is formed by ion implantation through the pad oxide film and pad silicon layer, thereby, the impurity oxidation at the time of the capacitance oxide film formation is suppressed, and a high capacitance value can be realized.

Thirdly, when the present invention is applied to the capacitor of the DRAM, the process can be shortened, and the cell area can be reduced.

Disclosed embodiment can be varied by a skilled person without departing from the spirit and scope of the invention, which is intended to be encompassed by the following claims.

What is claimed is:

1. A semiconductor device having a capacitance element, comprising:
   an element isolation film formed so as to surround an element formation area on a first conductive-type semiconductor substrate;
   a second conductive-type impurity layer formed on a surface of the element formation area;

a capacitance insulation film formed of a pad oxide film formed on the second conductive-type impurity layer;

a first silicon layer including a pad-silicon layer formed on the capacitance insulation film; and a second silicon layer, which is formed on the first silicon layer and extends on the element isolation film;

wherein the first and the second silicon layers are an upper electrode of the capacitance element, the impurity layer is a lower electrode of the capacitance element, and the second silicon layer extends on the element isolation film but the first silicon layer does not.

2. The semiconductor device having a capacitance element according to claim 1, wherein the first and the second silicon layers are a polycrystalline silicon layer or an amorphous silicon layer.

3. The semiconductor device having the capacitance element according to claim 2, wherein the first silicon layer is the polycrystalline silicon layer or the amorphous silicon layer in which the impurities are doped in higher density than that of the second silicon layer.

4. The semiconductor device having the capacitance element according to either one of claim 1 or claim 2, wherein the second silicon layers is covered by a metallic silicide film.

5. A semiconductor device having a capacitance element, comprising:

an element isolation film formed so as to surround an element formation area on a first conductive-type semiconductor substrate;

a capacitance element formed of a second conductive-type impurity layer formed on a surface of the element formation area, an insulation film formed of a pad oxide film formed in the element formation area;

a cell plate electrode formed on the insulation film;

a MOSFET composed of a source layer which is formed in the situation that it adjoins the capacitance element and is superimposed on the impurity layer, a drain layer constituting a bit line, an insulation film constituting a gate insulation film, and a gate electrode constituting a word line formed on the insulation film, wherein the cell plate electrode and the gate electrode are structured such that a first silicon layer and a second silicon layer which are formed of a pad silicon layers, are stacked on the element formation area, and the second silicon layer constituting the cell plate electrode extends on the element isolation film.

* * * * *